(12) United States Patent
Kim et al.

(10) Patent No.: US 7,888,150 B2
(45) Date of Patent: Feb. 15, 2011

(54) DISPLAY AND METHOD OF MANUFACTURING THE SAME

(75) Inventors: Cheol Min Kim, Seongnam (KR); Gi Chang Lee, Seoul (KR); Yang Hwa Choi, Yongin (KR)

(73) Assignee: Samsung Electronics Co., Ltd. (KR)

( * ) Notice: Subject to any disclaimer, the term of this patent is extended or adjusted under 35 U.S.C. 154(b) by 469 days.

(21) Appl. No.: 11/985,525

(22) Filed: Nov. 14, 2007

(65) Prior Publication Data

US 2008/0135851 A1 Jun. 12, 2008

(30) Foreign Application Priority Data

Nov. 15, 2006 (KR) .................. 10-2006-0112858

(51) Int. Cl.
*H01L 21/00* (2006.01)
(52) U.S. Cl. .............. 438/30; 438/144; 438/145; 257/E27.13; 257/E27.131; 257/E27.132; 257/E27.133
(58) Field of Classification Search ............ 438/30, 438/144–145, 149, 153–155, 164; 257/59, 257/66, 72, 458, E27.13–E27.133
See application file for complete search history.

(56) References Cited

U.S. PATENT DOCUMENTS

| 7,030,551 B2 | 4/2006 | Yamazaki et al. |
| 7,061,019 B2 * | 6/2006 | Ishida et al. .......... 257/72 |
| 2004/0008172 A1 | 1/2004 | Nakamura et al. |
| 2005/0258486 A1 * | 11/2005 | Yoon .................. 257/347 |

FOREIGN PATENT DOCUMENTS

| JP | 2004-45875 | 2/2004 |
| JP | 2004-45879 | 2/2004 |
| JP | 2004-93894 | 3/2004 |
| JP | 2005-19636 | 1/2005 |
| JP | 2005-43672 | 2/2005 |
| JP | 2005-72126 | 3/2005 |
| JP | 2005-107383 | 4/2005 |
| JP | 2006-3857 | 1/2006 |
| JP | 2006-30317 | 2/2006 |

(Continued)

OTHER PUBLICATIONS

English Language Abstract, Publication No. JP2004045875, Feb. 12, 2004, 1 p.

(Continued)

*Primary Examiner*—Michael S Lebentritt
*Assistant Examiner*—Daniel Whalen
(74) *Attorney, Agent, or Firm*—Innovation Counsel LLP

(57) ABSTRACT

The present invention provides a display comprising a panel having a display region for displaying an image and a peripheral region defined therein, a plurality of thin film transistors (TFTs) formed in the display region, p-type and n-type TFTs formed in the peripheral region, and at least one photo diode formed in a horizontal structure in the display or peripheral region; and a method of manufacturing the display. According to the present invention, n-type and p-type TFTs and a photo diode can be together formed without an additional process when forming the TFTs using a polycrystalline silicon thin film, and various peripheral circuits can be configured using such elements.

6 Claims, 12 Drawing Sheets

FOREIGN PATENT DOCUMENTS

| | | |
|---|---|---|
| KR | 2000-0016257 | 3/2000 |
| KR | 10-2006-0049286 | 5/2006 |

OTHER PUBLICATIONS

English Language Abstract, Publication No. JP2004045879, Feb. 12, 2004, 1 p.

English Language Abstract, Publication No. JP2004093894, Mar. 25, 2004, 1 p.

English Language Abstract, Publication No. JP2005019636, Jan. 20, 2005, 1 p.

English Language Abstract, Publication No. JP2005043672, Feb. 17, 2005, 1 p.

English Language Abstract, Publication No. JP2005072126, Mar. 17, 2005, 1 p.

English Language Abstract, Publication No. JP2005107383, Apr. 21, 2005, 1 p.

English Language Abstract, Publication No. JP2006003857, Jan. 5, 2006, 1 p.

English Language Abstract, Publication No. JP2006030317, Feb. 2, 2006, 1 p.

Korean Patent Abstracts, Publication No. 1020000016257, Mar. 25, 2000, 1 p.

Korean Patent Abstracts, Publication No. 1020060049286, May 18, 2006, 1 p.

* cited by examiner

DISPLAY AND METHOD OF MANUFACTURING THE SAME

CROSS-REFERENCE TO RELATED APPLICATION

This application claims the benefit of priority of Korean Patent Application No. 10-2006-0112858 filed Nov. 15, 2006, the contents of which are incorporated herein by reference in its entirety.

BACKGROUND OF THE INVENTION

1. Field of Invention

The present invention relates to a liquid crystal display and a method of manufacturing the same.

2. Description of the Prior Art

A liquid crystal display (LCD) typically comprises a plurality of thin film transistors (TFT) each having a pixel electrode, formed on a first substrate, a second substrate which includes a color filter and a common electrode, and a liquid crystal layer interposed between the first and second substrates. The LCD displays images by orienting liquid crystals to adjust the transmittance of light by applying voltage to the two substrates.

The TFT of such an LCD is typically formed as a semiconductor layer using amorphous silicon or polycrystalline silicon. A TFT manufactured with amorphous silicon has an advantage in that the uniformity of amorphous silicon film is superior and thus the characteristics of the TFTs are consistent. However, since an amorphous silicon TFT has low electric charge mobility, the response time of elements is long. Therefore, it is disadvantageous to use amorphous silicon TFTs in high-resolution display panel, or for driving elements of gate or data drivers which require a short response time.

However, since a TFT manufactured with polycrystalline silicon has high electric charge mobility, it is advantageous to use this type of TFT for a high-resolution LCD panel that requires short response time, as well as in peripheral driving circuits for the display panel.

In light of the development of digital convergence, there have been many attempts to embody additional functions for displaying images in an LCD. For example, it is desirable to add an automatic luminance adjusting function, a touch screen function, a scanning function and other features to an LCD. In order to achieve such additional functions, light receiving elements such as photo diodes need to be provided in an LCD panel. However, such light receiving elements are generally provided in a TFT substrate in which a circuit is easily configured.

However, since it is difficult to manufacture the TFT substrate together with photo diodes in the prior art, the aforementioned additional functions are implemented in such a manner that only circuits for connection are formed on TFT substrate and then separately manufactured photo diodes are mounted on the circuits of TFT substrate. Accordingly, there is a problem in that the manufacturing cost is increased due to the processes of manufacturing and mounting the photo diodes. A further disadvantage is that it is difficult to manufacture a thin LCD.

SUMMARY OF THE INVENTION

Accordingly, the present invention is conceived to solve the aforementioned problems in the prior art. An object of the present invention is to provide a display wherein a peripheral circuit and a photo diode are together formed without an additional process when forming a thin film transistor using a polycrystalline silicon thin film, thereby reducing the manufacturing cost and advantageously manufacturing an LCD to be thin, and a method of manufacturing the display.

According to an aspect of the present invention for achieving the objects, there is provided a display comprising a panel having a display region for displaying an image and a peripheral region defined therein; a plurality of thin film transistors (TFTs) formed in the display region; p-type and n-type TFTs formed in the peripheral region; and at least one photo diode formed in a horizontal structure in the display or peripheral region.

The TFT preferably includes an active layer formed of a low temperature polycrystalline silicon thin film.

A driving circuit having at least one of the p-type and n-type TFTs may be formed in the peripheral region. At this time, the photo diode preferably includes an active layer formed of a low temperature polycrystalline silicon thin film.

Preferably, the active layer of the photo diode comprises a p-type region formed when the p-type TFT is formed, an n-type region formed when the n-type TFT is formed, and an intrinsic region formed between the p-type and n-type regions.

The panel may comprise a first substrate with color filters arranged in the shape of a lattice and a second substrate with the plurality of TFTs arranged in the shape of a lattice.

According to another aspect of the present invention, there is provided a method of manufacturing a display, comprising the steps of providing a substrate having display and peripheral regions defined therein; forming a plurality of TFTs in the shape of a lattice in the display region; forming p-type and n-type TFTs in the peripheral region; and forming at least one photo diode in the display or peripheral region, wherein the photo diode is simultaneously formed together with the p-type and n-type TFTs.

The step of forming the photo diode may comprise the steps of forming an active layer for a p-type TFT, an active layer for an n-type TFT and an active layer for a photo diode on top of the substrate; implanting p-type ions into one side region of the active layer for a photo diode with a central region thereof interposed between the one side region and the other side region simultaneously when implanting p-type ions into the active layer for a p-type TFT; and implanting n-type ions into the other side region of the active layer for a photo diode with the central region thereof interposed between the one side region and the other side region simultaneously when implanting n-type ions into the active layer for an n-type TFT.

At least one of the active layers for a p-type TFT, an n-type TFT and a photo diode is preferably formed of a low temperature polycrystalline silicon thin film.

The photo diode is formed in a horizontal structure.

According to a further aspect of the present invention, there is provided a method of manufacturing a display, comprising the steps of forming an active layer for a p-type TFT, an active layer for an n-type TFT and an active layer for a photo diode on top of a substrate; forming p-type regions at both side regions of the active layer for a p-type TFT with a central region thereof interposed therebetween, and forming a p-type region at one side region of the active layer for a photo diode with a central region thereof interposed between the one side region and the other side region; and forming n-type regions at both side regions of the active layer for an n-type TFT with a central region thereof interposed therebetween, and forming an n-type region at the other side region of the active layer for a photo diode with the central region thereof interposed between the one side region and the other side region.

The method may further comprise the step of forming lightly doped drains at both sides of the central region of at least one of the active layers for a p-type TFT, an n-type TFT and a photo diode.

The step of forming the p-type regions preferably comprises the steps of forming a conductive film on top of the substrate, patterning the conductive film to form a first conductive film pattern, and implanting p-type ions into the corresponding active layers using the first conductive film pattern as an ion implantation mask to form the p-type regions at the corresponding regions of the active layers; and the step of forming the p-type regions preferably comprises the steps of forming a barrier layer on the first conductive film pattern, patterning the barrier layer to form a barrier layer pattern, and implanting n-type ions into the corresponding active layers using the barrier layer pattern as an ion implantation mask to form the n-type regions at the corresponding regions of the active layers.

At least one of the active layers for a p-type TFT, an n-type TFT and a photo diode preferably is formed of a low temperature polycrystalline silicon thin film through the steps of forming a low temperature amorphous silicon thin film on top of the substrate; and crystallizing the silicon thin film through any one method of SPC (Solid Phase Crystallization), ELC (Excimer Laser Crystallization), and MIC (Metal Induced Crystallization).

BRIEF DESCRIPTION OF THE DRAWINGS

The above and other features and advantages of the present invention will become apparent from the following description of the invention in conjunction with the accompanying drawings, in which.

DETAILED DESCRIPTION OF THE PREFERRED EMBODIMENT

Figure 1:
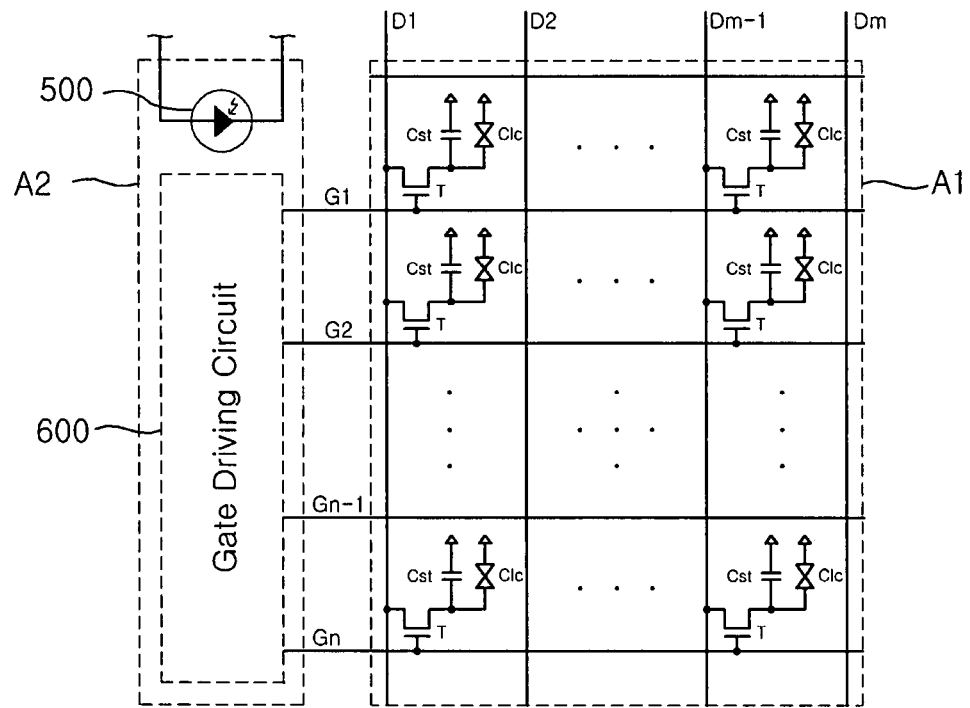
FIG. 1 is a combination circuit and block diagram of a liquid crystal display (LCD) panel according to a first embodiment of the present invention.

Hereinafter, preferred embodiments of the present invention are described in detail with reference to the accompanying drawings. However, the present invention is not limited to the embodiments but may be embodied in different forms. These embodiments are provided only for illustrative purposes and for full understanding of the scope of the present invention by those skilled in the art.

In the drawings, the thicknesses of layers and regions are exaggerated for clarity thereof, and like reference numerals are used to designate like elements throughout the specification and drawings. Further, the expression that an element such as a layer, region, substrate or plate is placed on or above another element includes not only a case where the element is placed directly on or just above the other element but also a case where a further element is interposed between the element and the other element.

Figure 2:
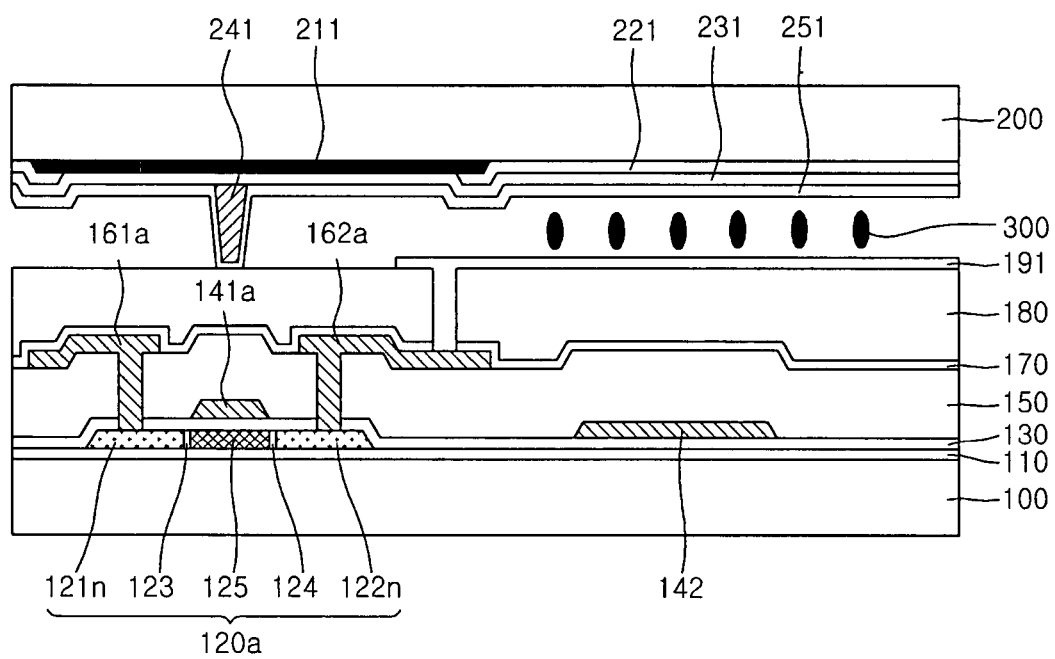
FIG. 2 is a cross-sectional view showing a display region of the LCD panel according to the first embodiment of the present invention.
Figure 3A:
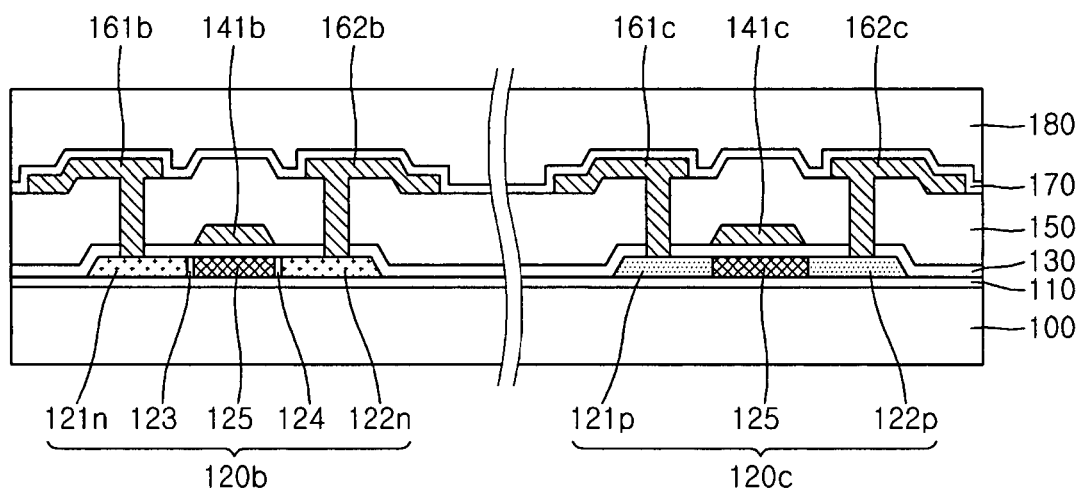
FIG. 3 is a cross-sectional view showing a peripheral region of the LCD panel according to the first embodiment of the present invention.
Figure 3B:
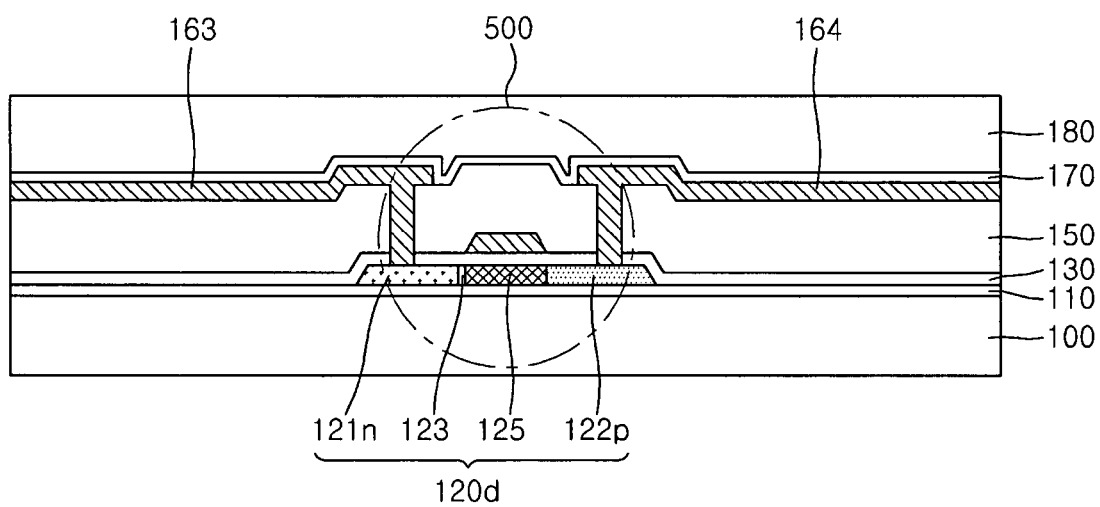

FIG. 1 is a circuit and block diagram of a liquid crystal display (LCD) panel according to a first embodiment of the present invention, FIG. 2 is a cross-sectional view showing a display region of the LCD panel according to the first embodiment of the present invention, and FIGS. 3A and 3B are cross-sectional views showing a peripheral region of the LCD panel according to the first embodiment of the present invention.

Referring to FIGS. 1 to 3B, the LCD panel according to this embodiment comprises TFT and color filter substrates 100 and 200, respectively, facing each other, and a liquid crystal layer 300 interposed between the two substrates. Further, the LCD panel includes a display region A1 having unit pixels arranged thereon and a peripheral region A2 having a variety of elements arranged thereon, which are separated from each other.

In the display region A1 of the TFT substrate 100, there is formed a plurality of gate lines G1 to Gn extending in an x direction, a plurality of data lines D1 to Dm. extending in a y direction perpendicularly intersecting the gate lines. The respective unit pixels are defined in the intersection regions of the gate lines G1 to Gn and the data lines D1 to Dm. A TFT T, a pixel electrode 191 and a storage electrode 142 are formed in each of the unit pixels.

The TFT T comprises an active layer 120a, a gate electrode 141a, a source electrode 161a and a drain electrode 162a.

Preferably, the active layer 120a is formed of a low temperature poly silicon (LPTS) thin film. Source and drain regions 121n and 122n, respectively, are formed in side regions of the active layer 120a by implanting high concentration ions thereinto. A channel region 125 into which ions are not implanted, is positioned in a central region of the active layer 120a. A characteristic of the TFT T is changed depending on the ions injected into the side regions of the active layer 120a. For example, in a case where the TFT T has an n channel, a high concentration n-type ions are implanted into both the side regions of the active layer 120a; and when the TFT T has a p channel, a high concentration p-type ions are implanted into both the side regions of the active layer 120a. In this embodiment, the TFT T formed in the display region A1 is formed to have an n channel, and has lightly doped drain 123 and source 124 into which low concentration ions are implanted between the channel region 125 and source and drain regions 121n and 122n, respectively, in order to prevent a phenomenon such as a leakage current or punch through between the channel region 125 and source and drain regions 121n and 122n, respectively. It will be apparent that the lightly doped drain 123 and source 124 may be omitted.

The source and drain regions 121n and 122n of the active layer 120a are connected to the source and drain electrodes 161a and 162a through contact holes, respectively, and the gate electrode 141a is formed on top of the active layer 120a so as to form the TFT T. The gate electrode 141a of the TFT T is connected to one of the gate lines G1 to Gn, the source electrode 161a of the TFT T is connected to one of the data lines D1 to Dm, and the drain electrode 162a of the TFT T is connected to the pixel electrode 191. The TFT T is turned on by a gate signal transmitted through the one of the gate lines G1 to Gn and thus the source and drain electrodes 161a and 162a are electrically connected to each other, whereby the data signal transmitted through the one of the data lines D1 to Dm is transmitted to the pixel electrode 191.

The pixel electrode 191 forms one plate of a liquid crystal capacitor Clc taken together with a common electrode 251 formed on the color filter substrate 200 facing the TFT substrate 100. Such a liquid crystal capacitor Clc serves to control the alignment of molecules in the liquid crystal layer 300 by allowing a data signal to charge the liquid crystal capacitor Clc.

The storage electrode 142 forms one plate of a storage capacitor Cst taken together with the pixel electrode 191 which is positioned above the pixel electrode 191. Storage capacitor Cst serves to stably hold a data signal charge into the pixel electrode 191 until the next data signal is received. Storage electrode 142 is connected to a storage line (not shown) extending in parallel with the gate lines G1 to Gn, so that a reference voltage such as a common voltage is applied. At least one photo diode 500 and a gate driving circuit 600 for providing the gate signals to the gate lines G1 to Gn are formed in the peripheral region A2 of the TFT substrate 100.

The gate driving circuit 600 is operated in accordance with control signals of an external liquid crystal driving circuit, and thus sequentially applies the gate signals including turn-on and turn-off voltages of the TFT T to the respective gate lines at appropriate timing. The gate driving circuit 600 is configured so that one or more TFTs with an active layer having an n channel (hereinafter, n-type TFTs) and/or one or more TFTs with an active layer having a p channel (hereinafter, p-type TFTs) are mutually connected.

As shown in FIG. 3B, photo diode 500 comprises an active layer 120d in which an n-type region 121n with high concentration n-type ions is implanted, a lightly doped drain 123 with low concentration n-type ions implanted, an intrinsic region 125 with no ions implanted, and a p-type region 122p with high concentration p-type ions implanted are formed in the horizontal direction to form a PIN bonding structure. The lightly doped drain 123 may be omitted. If external light is incident on the intrinsic region 125 in a state where the photo diode 500 is reverse biased, a current flows in the photo diode 500. Since the amount of current which flows is a function of the intensity of the light, photo diode 500 may be used as a sensor for sensing light, i.e., a light receiving element. Accordingly, a variety of additional functions using the photo diode 500 can be provided to the LCD panel. For example, a luminance adjusting function, a touch screen function, a scanning function and the like may be embedded into the LCD panel using the photo diode 500 as a light receiving element. Further, although the photo diode 500 of this embodiment is formed in the peripheral region A2, the photo diode 500 may be formed as one photo diode in not the peripheral region A2 but the display region A1 depending on a desired object. Alternatively, a plurality of photo diodes like photo diode 500 may be utilized.

In the display region A1 of the color filter substrate 200 facing the TFT substrate 100, there are formed a black matrix 211 in the form of a lattice to prevent light interference with adjacent pixel regions by blocking incident light; red R, green G and blue B color filters 221 through which an image is colored by coloring the incident light, and the common electrode 251 forming an electric field in the liquid crystal layer 300 together with the pixel electrode 191 formed on the TFT substrate 100 facing the color filter substrate 200.

An overcoat film 231 for enhancing adhesion between the color filters 221 and the common electrode 251 and planarity thereof may be formed therebetween. Further, column spacers 241 with a predetermined height for maintaining a cell gap may be formed on the overcoat film 231. The column spacers 241 may be formed on at least any one of the TFT and color filter substrates 100 and 200. In a case where the column spacers 241 are formed on the color filter substrate 200, the column spacers 241 may be formed on a top surface of any one of the black matrix 211, the color filters 221, the overcoat film 231 and the common electrode 251. Further, the column spacers 241 may be replaced with ball-type spacers having a predetermined diameter to maintain the cell gap by scattering the spacers on a surface of at least one substrate facing the other substrate.

A method of manufacturing the TFT substrate in the LCD panel so configured according to the present invention is described with reference with FIGS. 4A through 10C.

FIGS. 4A to 10C are sectional views illustrating a process of manufacturing a TFT substrate according the first embodiment of the present invention, wherein FIGS. 4A to 10A are sectional views of a unit pixel formed in the display region, FIGS. 4B to 10B are sectional views of n-type and p-type TFTs formed in the peripheral region, and FIGS. 4C to 10C are sectional views of a photo diode formed in the peripheral region.

Figure 4A:
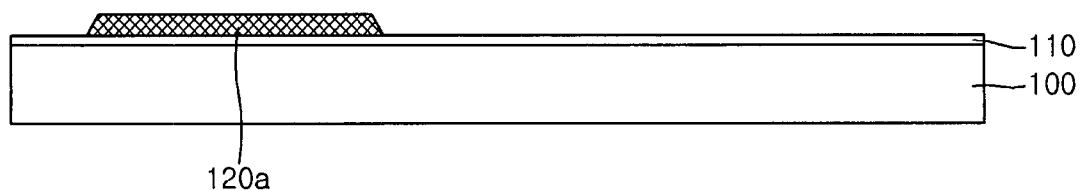
FIGS. 4 to 10 are cross-sectional views illustrating a process of manufacturing a thin film transistor (TFT) substrate according the first embodiment of the present invention.
Figure 4B:
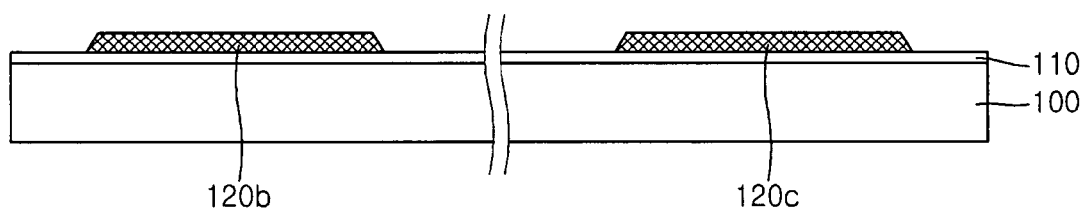
Figure 4C:
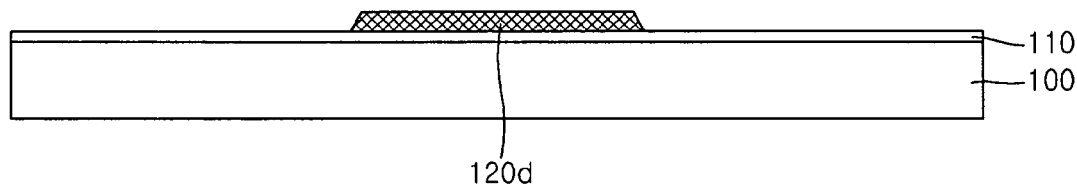

Referring to FIGS. 4A, 4B and 4C, a buffer film 110 is formed on a first light transmissive insulation substrate 100, and a semiconductor film is formed on the buffer film 110. Then, the semiconductor film is patterned to be divided into a plurality of active layers 120a, 120b, 120c and 120d.

Here, any one of glass, quartz and plastic substrates may be used as the first light transmissive insulation substrate 100, and an inorganic insulation material including $SiO_2$ or $SiN_x$ may be used for the buffer film 110. Further, the semiconductor film is formed using a low temperature polycrystalline silicon thin film, wherein the low temperature polycrystalline silicon thin film is formed by crystallizing an amorphous silicon thin film to a polycrystalline silicon thin film at a low temperature after forming the amorphous silicon thin film. Here, SPC (Solid Phase Crystallization), ELC (Excimer Laser Crystallization), MIC (Metal Induced Crystallization) or the like is widely used as a method of crystallizing an amorphous silicon thin film to a low-temperature polysilicon thin film. The process of crystallizing an amorphous silicon thin film to a polycrystalline silicon thin film may be performed before or after a process of patterning a semiconductor film.

In the patterning process, a photoresist is applied on the semiconductor film, a predetermined photoresist pattern is formed by performing a photo process using a mask, and a process of etching the lower semiconductor film is performed using the photoresist pattern as an etching mask. At this time, the active layer 120a for an n-type TFT is formed in the display region, the active layer 120b for an n-type TFT and the active layer 120c for a p-type TFT are formed in the peripheral region, and the active layer 120d for a photo diode is formed in a non-display region.

Figure 5A:
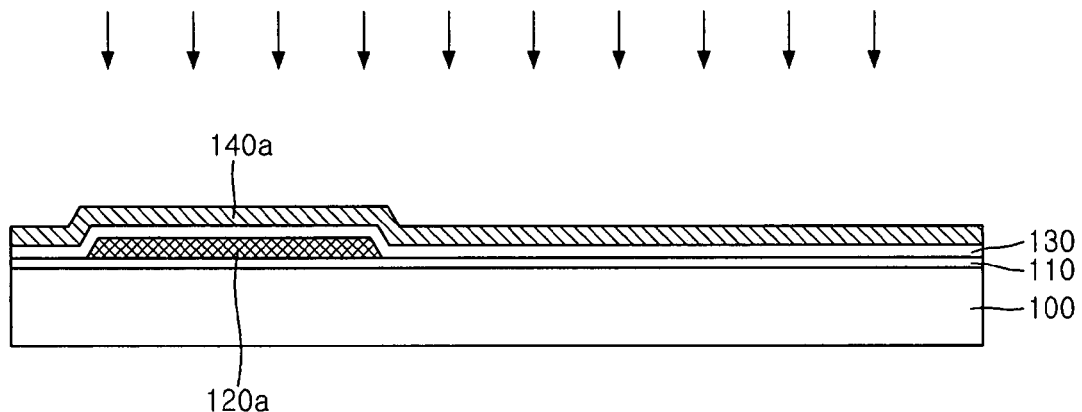
Figure 5B:
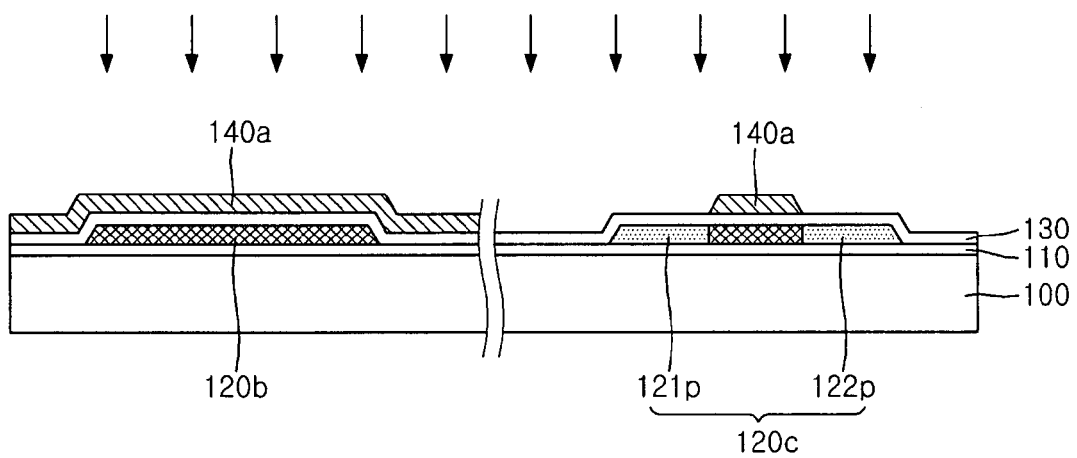
Figure 5C:
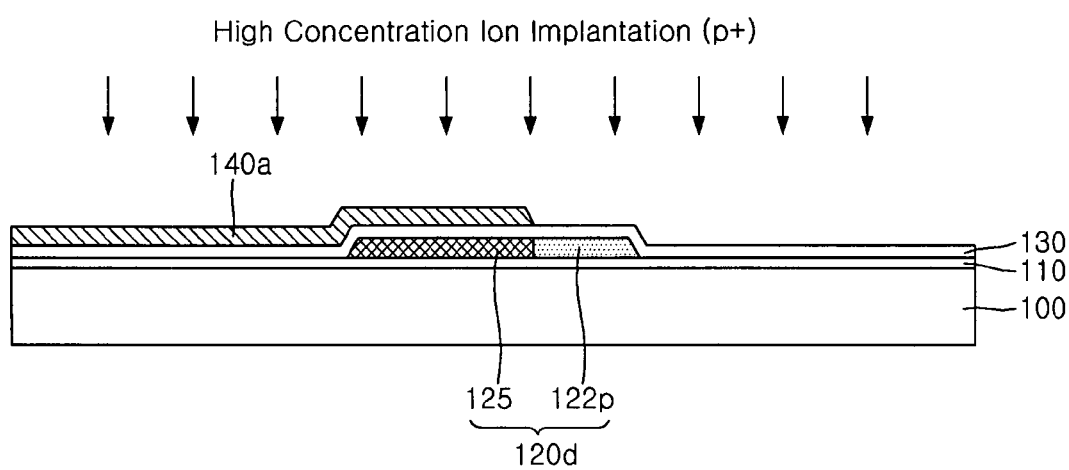

Referring to FIGS. 5A, 5B and 5C, a first insulation film 130 and a first conductive film are formed on the entire structure including the active layers 120a, 120b, 120c and 120d, and the first conductive film is then patterned to form a primary first conductive film pattern 140a. Then, high concentration p-type ions ($p^+$) are implanted into the active layers 120c and 120d using the primary first conductive film pattern 140a as an ion implantation mask. As a result, p-type regions 121p and 122p are respectively formed at both side regions of the active layer 120c for a p-type TFT with the central region thereof interposed therebetween, and a p-type region 122p is formed at a side region of the active layer 120d for a photo diode with the central region thereof interposed between the side region and the other side region in which an n-type region 121n will be formed.

Figure 6A:
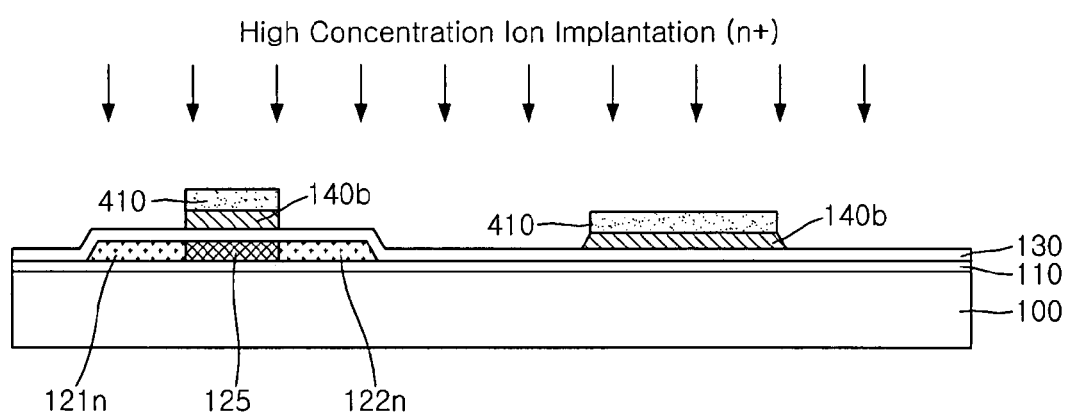
Figure 6B:
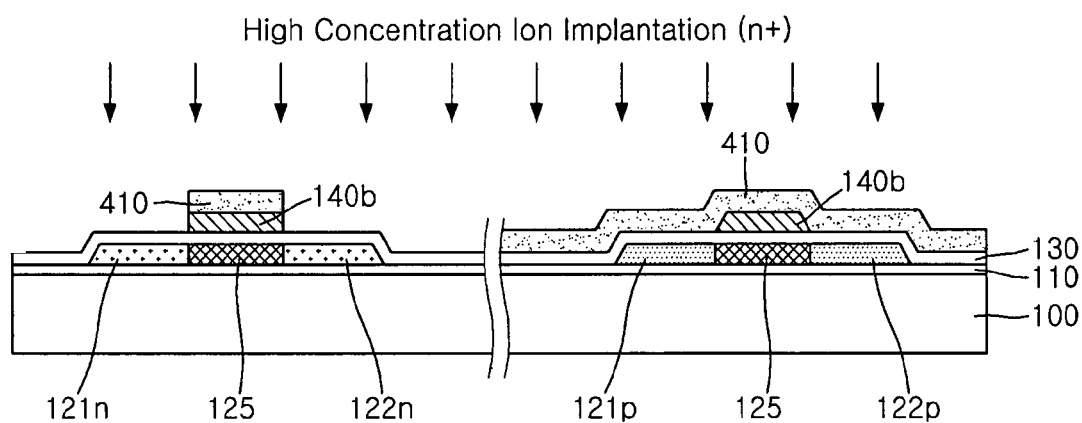
Figure 6C:
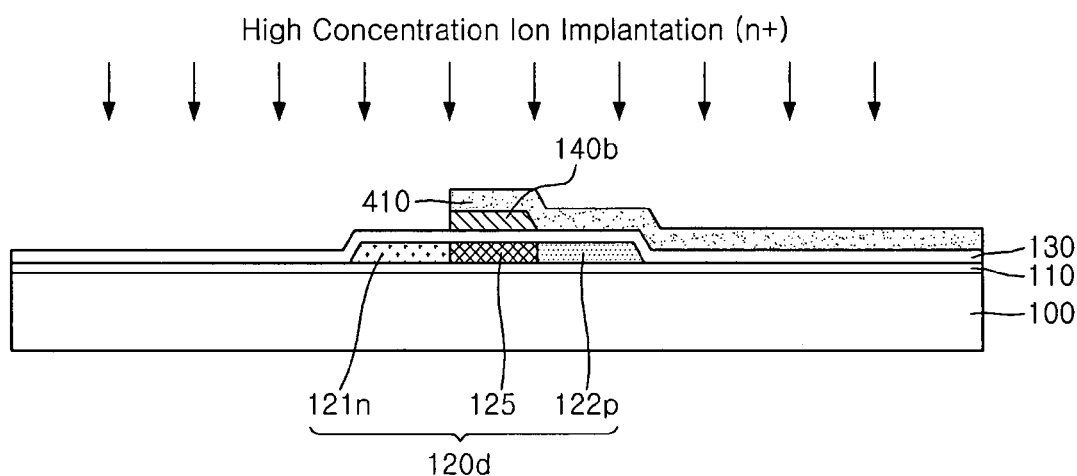
Figure 7A:
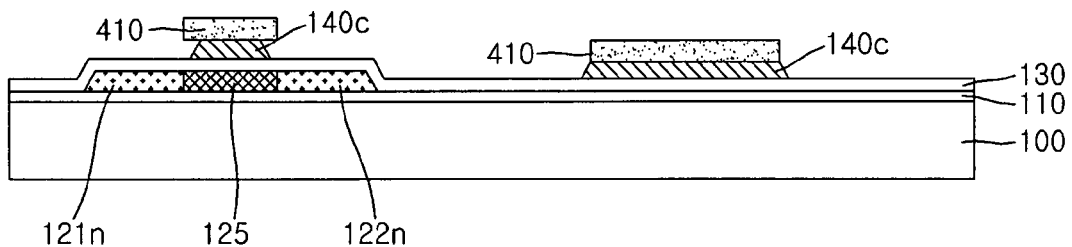
Figure 7B:
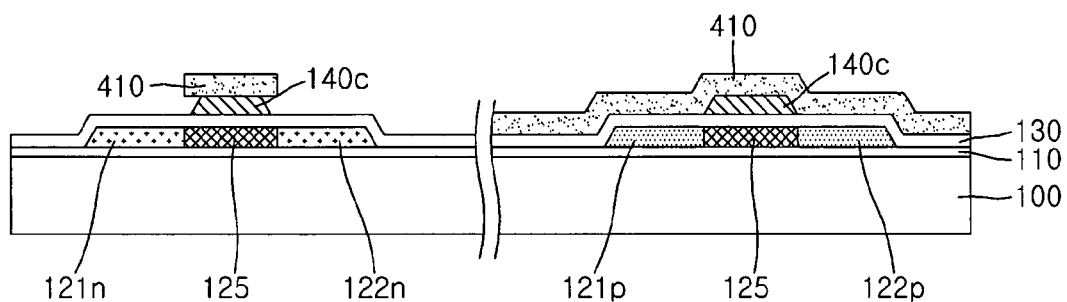
Figure 7C:
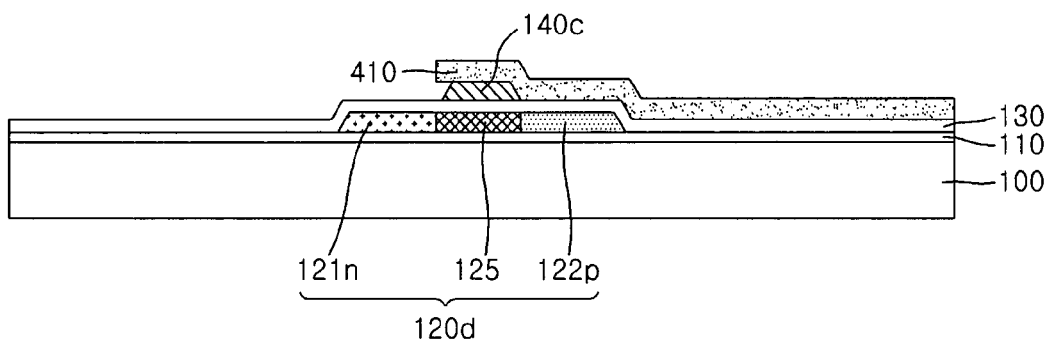

Referring to FIGS. 6A, 6B and 6C, a barrier layer is formed on the entire structure including the primary first conductive film pattern 140a, and then patterned to a predetermined barrier layer pattern 410. Then, the primary first conductive film pattern 140a is etched through an etching process using the barrier layer pattern as an etching mask to form a secondary conductive film pattern 140b, and high concentration n-type ions ($n^+$) are implanted into the active layers 120a, 120b and 120d using the barrier layer pattern 410 as an ion implantation mask. As a result, n-type regions 121n and 122n are respectively formed at both side regions of each of the active layers 120a and 120b with the central region thereof interposed therebetween, and the n-type region 121n is formed at the other side region of the active layer 120d for the photo diode with the central region thereof interposed between both the side regions.

Figure 8A:
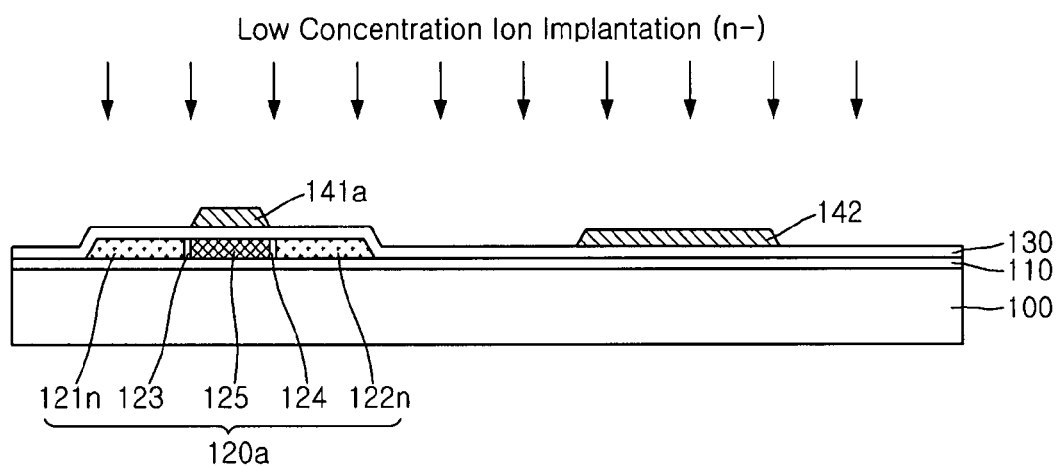
Figure 8B:
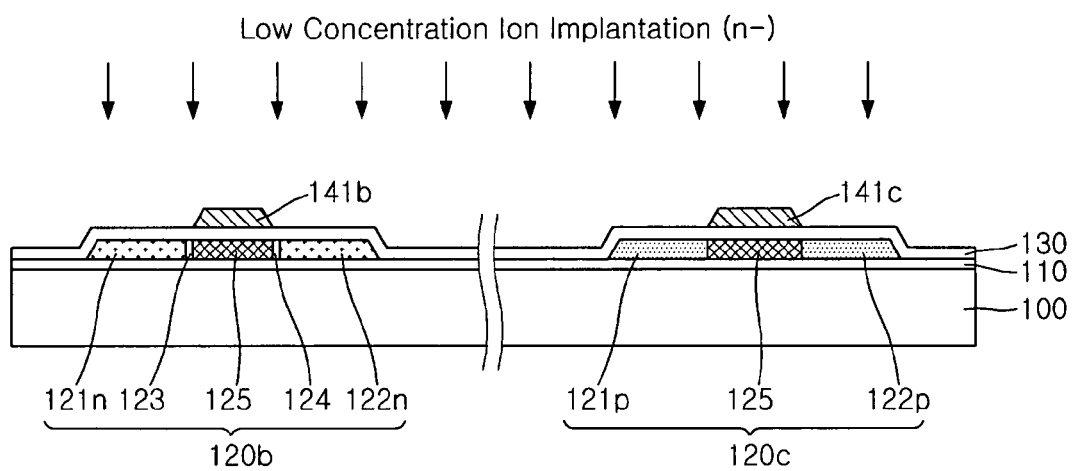
Figure 8C:
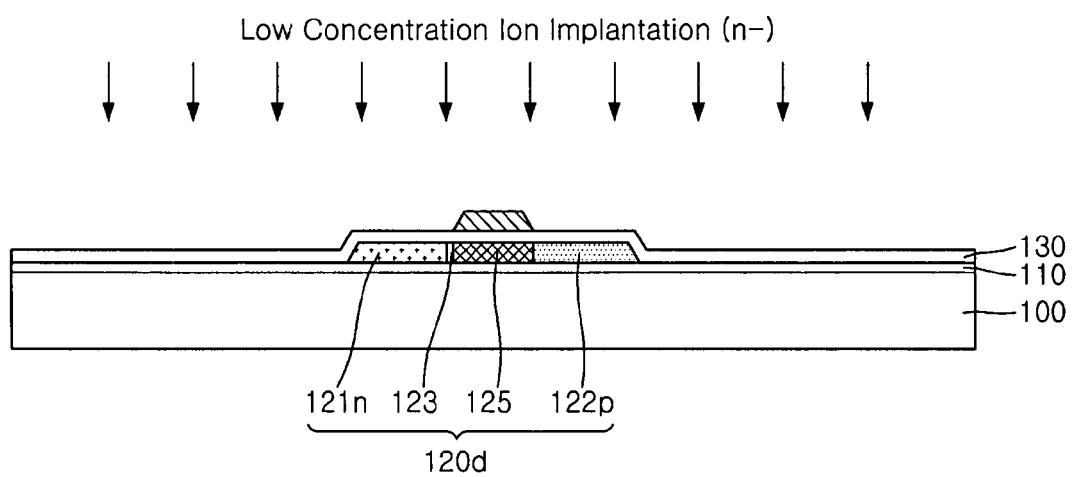

Referring to FIGS. 7A, 7B, 7C, 8A, 8B and 8C, the secondary conductive film pattern 140b is etched through an etching process using the barrier layer pattern 410 as an etching mask to form a tertiary first conductive film pattern 140c with a reduced width; and then as shown FIGS. 8A, 8B and 8C an exfoliation process for removing the residual of the barrier layer pattern 410 is performed. Next, a low concentration n-type ions ($n^-$) are implanted into the active layers 120a, 120b and 120d using the tertiary first conductive film pattern 140c as an ion implantation mask. As a result, the n-type regions 121n and 122n, lightly doped drains 123 and 124 and the center region 125 are formed in each of the active layers 120a and 120b for an n-type TFT. Further, the n-type region 121n, the lightly doped drain 123, the center region 125 and the p-type region 122p are formed in the active layer 120d for a photo diode. Here, the center region 125 of each of the active layers 120a, 120b and 120d, which is an intrinsic region in which no ion is implanted, becomes a channel region in case of an n-type TFT, and a light receiving region in case of a photo diode. The low concentration ion implantation process may be omitted. Preferably, gate electrodes 141a, 141b and 141c, a gate line (not shown), a storage electrode 142, a storage line (not shown) and the like are formed from the tertiary first conductive film pattern 140c in this embodiment. However, some of them may be formed from the primary or secondary first conductive film pattern 140a or 140b.

Figure 9A:
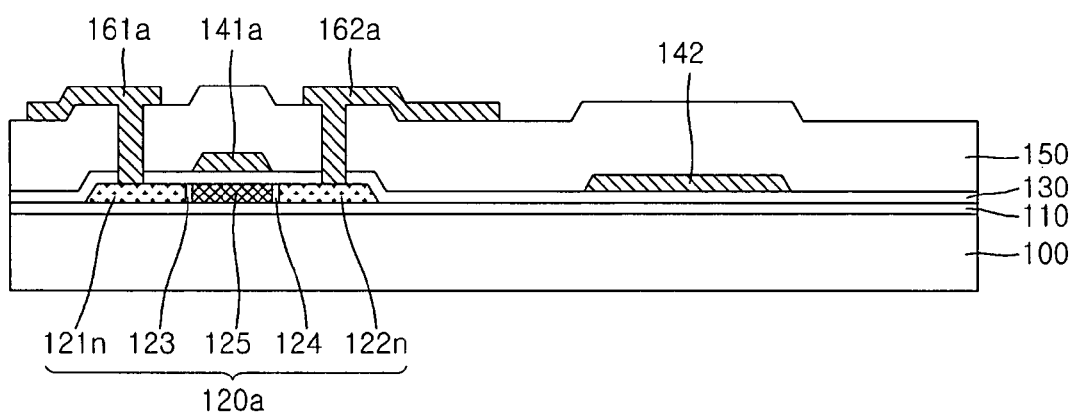
Figure 9B:
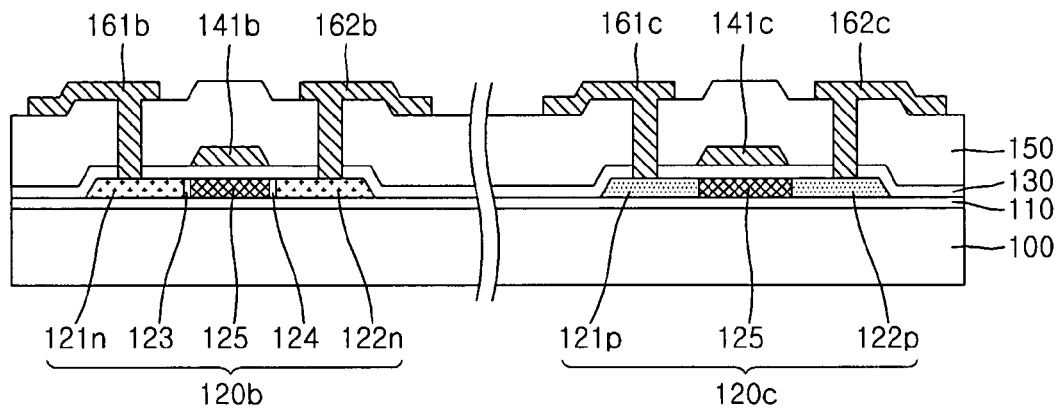
Figure 9C:
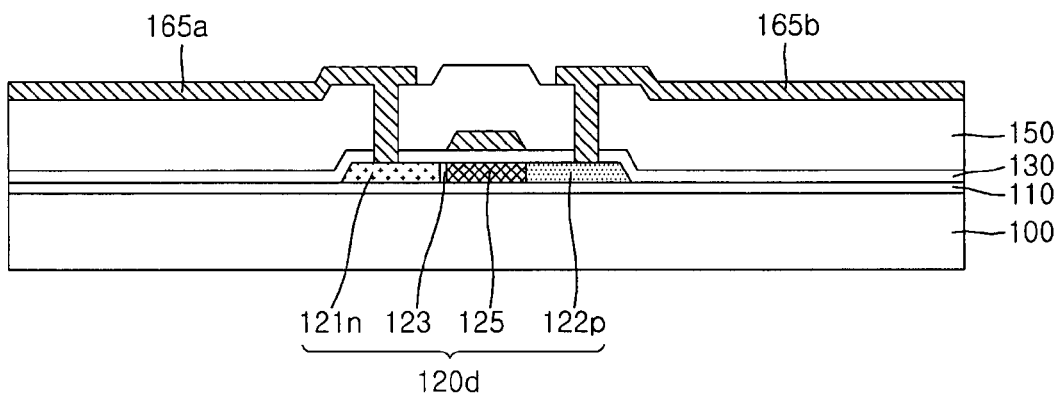

Referring to FIGS. 9A, 9B and 9C, a second insulation film 150 is formed on the entire structure including the gate electrodes 141a, 141b and 141c, and then patterned to form contact holes. Then, a second conductive film is formed on the entire structure including the contact holes, and then patterned to form source electrodes 161a, 161b and 161c, drain electrodes 162a, 162b and 162c and their connection wirings (not shown) and to form both electrodes 165a and 165b of the photo diode and their connection wirings (not shown).

In the former of the aforementioned patterning processes, a predetermined photoresist pattern is formed by applying photoresist on the second insulation film 150 and performing a photo process using a mask, and a process of etching the lower second insulation film 150 is then performed using the photoresist pattern as an etching mask. At this time, contact holes are formed by partially removing portions of the second insulation film 150 corresponding to both the n-type regions 121n and 122n of each of the active layers 120a and 120b for an n-type TFT, both the p-type regions 121p and 122p for a p-type TFT, the n-type and p-type regions 121n and 121p of the active layer 120d for a photo diode. Thereafter, an exfoliation process for removing the residual of the photoresist pattern is performed. Here, it is preferred that the second insulation film 150 be formed by depositing an inorganic insulation material including $SiO_2$ or $SiN_x$ in the form of a single- or multi-layered film.

In the latter of the aforementioned patterning processes, the second conductive film is formed on the entire structure including the contact holes, a predetermined photoresist pattern is formed by performing a photo process using a mask, and a process of etching the lower second conductive film is then performed using the photoresist pattern as an etching mask. At this time, in the display region, there are formed the source and drain electrodes 161a and 162a respectively connected to both the n-type regions 121n and 122n of the active layer 120a for an n-type TFT, and the data line (not shown) connected to the drain electrode 162a. Further, in the peripheral region, there are formed the source and drain electrodes 161b and 162b respectively connected to both the n-type regions 121n and 122n of the active layer 120b for an n-type TFT are formed, the source and drain electrodes 161c and 162c respectively connected to both the p-type regions 121p and 122p of the active layer 120c for a p-type TFT, and the connection wirings (not shown) respectively connected to the source and drain electrodes 161c and 162c. Furthermore, both the electrodes 165a and 165b respectively connected to the p-type and n-type regions 121n and 122p of the active layer 120d for a photo diode and the connection wirings (not shown) of both the electrodes 165a and 165b are also formed in the peripheral region. Thereafter, an exfoliation process for removing the residual of the photoresist pattern is performed. Preferably, the second conductive film is formed in a single- or multiple-layered structure of a metal including at least any one of Al, Mo, Cr, Ti, Ta, Ag and Nd.

Figure 10A:
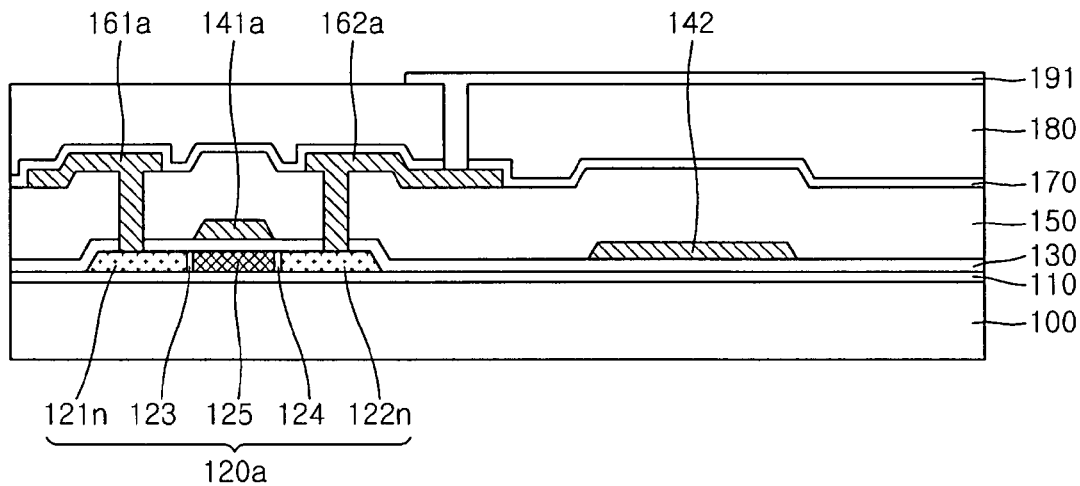
Figure 10B:
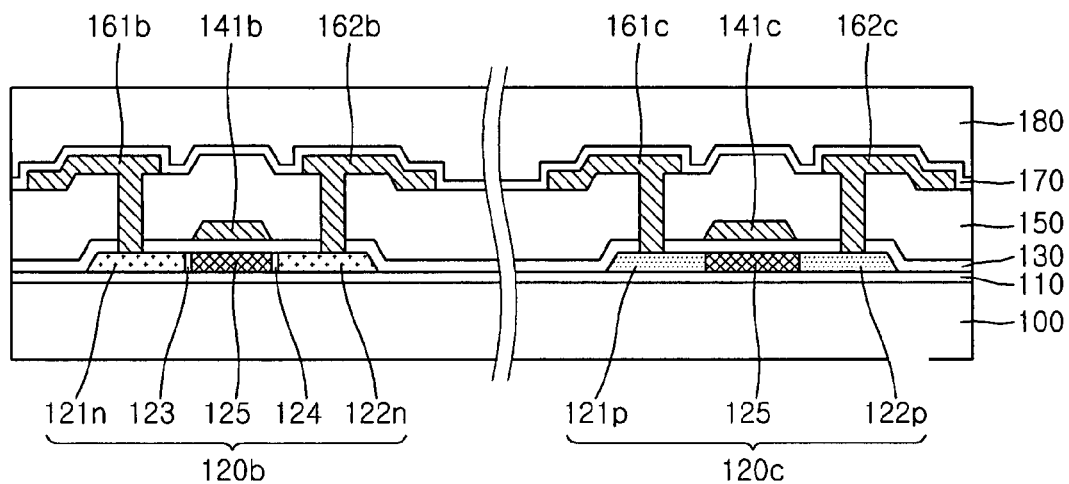
Figure 10C:
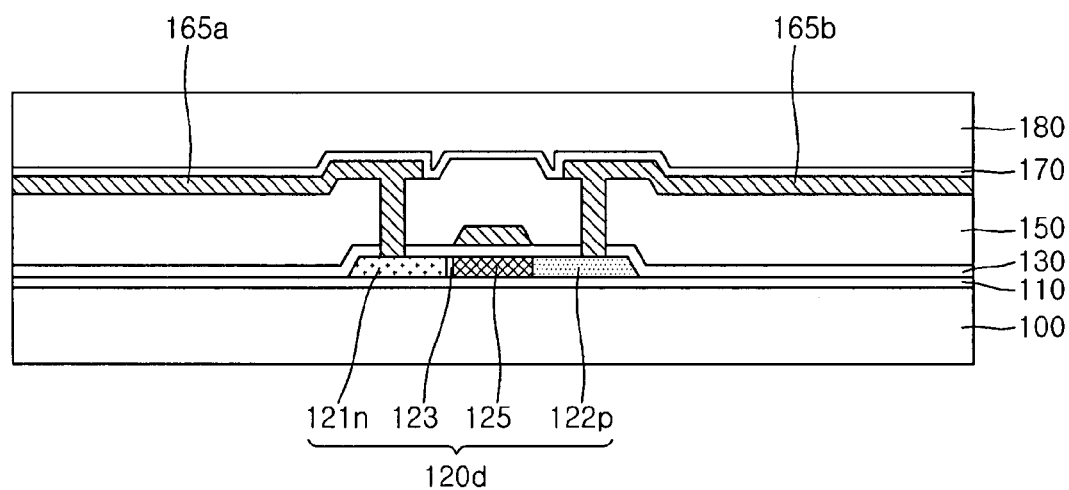

Referring to FIGS. 10A, 10B and 10C, protection films 170 and 180 are formed on the entire structure including the electrodes 161a, 161b, 161c, 162a, 162b and 162c and the connection wirings 165a and 165b, and then the protection films 170 and 180 are patterned to form contact holes. Thereafter, a light transmissive conductive film is formed on the entire structure including the contact holes, and then patterned to form a pixel electrode in each of the pixel regions.

In the former of the aforementioned patterning processes, a predetermined photoresist pattern is formed by applying photoresist on the protection films 170 and 180 and performing a photo process using a mask, and a process of etching the lower protection films 170 and 180 is then performed using the photoresist pattern as an etching mask. At this time, the contact holes are formed by removing portions of the protection films 170 and 180 corresponding to the drain electrode 162a for an n-type TFT in the display region. Thereafter, an exfoliation process for removing the residual of the photoresist pattern is performed.

Here, each of the protection films 170 and 180 may be formed in a single- or multiple-layered structure of an insulation material including at least any one of inorganic and organic insulation. Preferably, the protection film of this embodiment is formed of inorganic insulation such as $SiO_2$ or $SiN_x$ with superior insulative and adhesive properties, or organic insulation such as BCB (Benzene Cyclo Butane), SOG (Siloxane Polymer), or polyamide based resin with a low dielectric constant. If the protection film is formed in a thick film of organic insulation with a low permittivity, parasitic capacitance generated between the signal line G and/or D and the pixel electrode 191 is reduced. Accordingly, since the signal line G and/or D and the pixel electrode 191 can be formed such that they are partially overlapped with each other, an aperture ratio can be enhanced.

In the latter of the aforementioned patterning processes, the light transmissive conductive film is formed on the entire structure including the contact holes such that the contact holes are filled. Then, a predetermined photoresist pattern is formed by performing a photo process using a mask, and a process of etching the lower light transmissive conductive film is then performed using the photoresist pattern as an etching process. At this time, the pixel electrode 191 connected to the drain electrode 162a of the active layer 120b for an n-type TFT is formed in the display region. Thereafter, an exfoliation process for removing the residual of the photoresist pattern is performed.

Here, ITO (Indium Tin Oxide) or IZO (Indium Zinc Oxide) may be used to form the light transmissive conductive film.

If the process of manufacturing such a TFT substrate is used, n-type and p-type TFTs and a photo diode can be together formed without an additional process when forming the TFTs using a polycrystalline silicon thin film, and various peripheral circuits can be configured using such elements. Accordingly, the manufacturing cost can be reduced and an LCD can be advantageously manufactured to be thin, as compared with a prior art in which a variety of elements are separately manufactured and then mounted on a TFT substrate.

The TFT substrate according to the aforementioned first embodiment can be used appropriately to a transmission mode in which an image is displayed using a backlight positioned in rear of the TFT substrate. However, the present invention is not limited to the transmission mode, but can be applied to a transflective or reflective mode. As a possible example, a TFT substrate in accordance with a transflective mode will be described below.

Figure 11:
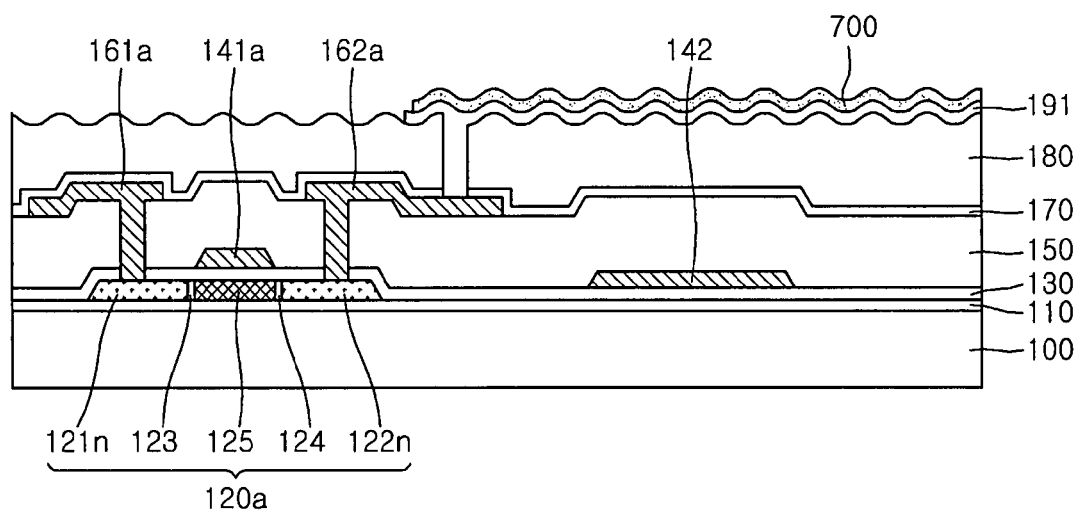
FIG. 11 is a cross-sectional view showing a unit pixel of a TFT substrate according to a second embodiment of the present invention.

FIG. 11 is a sectional view showing a unit pixel of a TFT substrate according to a second embodiment of the present invention.

Referring to FIG. 11, in the TFT substrate, a reflection pattern 700 is formed on at least a portion of a pixel electrode. The reflection pattern 700 allows the light incident from the top to be reflected and the light incident from the bottom to be output upward. As a result, an LCD with the TFT substrate 100 applied thereto is driven in a transflective mode in which an image is displayed using the light from both an internal backlight and an external light source.

A concavo-convex portion is preferably formed on the reflection pattern 700. The concavo-convex portion condenses light upward while inducing the diffused reflection of the light incident from the top, so that the light efficiency can be enhanced. Preferably, the reflection pattern 700 is formed of a metallic material such as Ag, Al, Au, Nd or Cu with superior light reflectivity such that the light incident from the top is reflected, and is formed to be thin such that the light incident from the bottom is transmitted. It will be apparent that a display region A1 is divided into transmission and reflection regions, so that the reflection pattern 700 is formed only in the reflection region. Also, a pixel region is divided into transmission and reflection regions, so that the reflection pattern 700 may be formed only in the reflection region.

In the process of manufacturing such a TFT substrate, protection films 170 and 180 are formed on an entire structure including electrodes 161a, 161b, 161c, 162a, 162b, 162c, 165a and 165b and connection wirings (not shown) as shown in FIG. 10 (a), and then, the protection films 170 and 180 are subjected to a primary patterning process for forming contact holes and a secondary patterning process for forming the concavo-convex portion on the surface of the protection film 180. Thereafter, a pixel electrode 191A is formed by forming and then patterning a light transmissive conductive film on the concavo-convex portion, and the reflection pattern 700 is formed by forming and then patterning a reflection film on the pixel electrode 191.

It will be apparent that a gate driving circuit 600 for supplying gate signals to gate lines G1 to Gn and at least one photo diode 500 are formed in a peripheral region A2 of the TFT substrate together with a TFT in the display region A1 as shown in FIG. 1.

Figure 12:
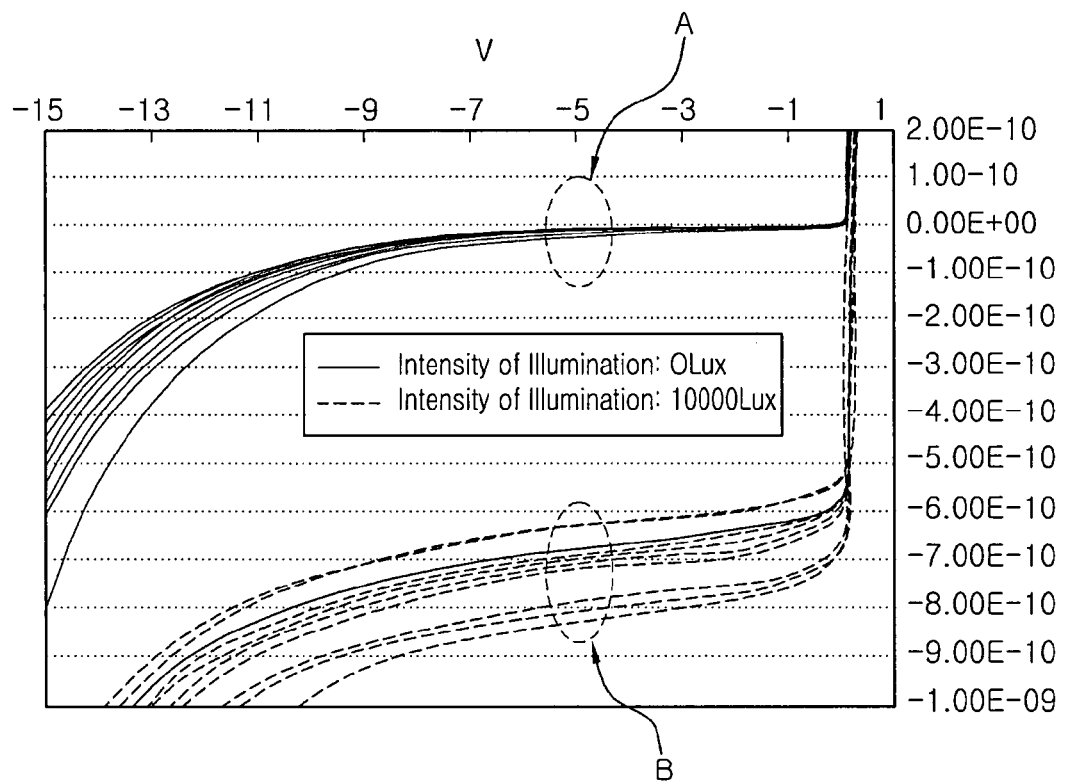
FIG. 12 is a graph illustrating a variation of a performance characteristic of a photo diode formed on the TFT substrate according to the present invention.

FIG. 12 is a graph illustrating a result in which a performance characteristic of the photo diode formed on the TFT substrate is measured according to the present invention.

Referring to FIG. 12, in a state where a photo diode 500 is reverse biased, line A represents a current flowing through the photo diode 500 at a light intensity of 0 Lux, and line B represents a current flowing through the photo diode 500 at a light intensity of 10,000 Lux. Comparing lines A and B, it can be seen that the current increases about 50 times at a light intensity of 110,000 Lux. This means that the light receiving ability of the photo diode 500 according to the present invention is very excellent.

A process of manufacturing a color filter substrate 200 is performed separately from the process of manufacturing the TFT substrate 100 according to the first and second embodiments. A process of manufacturing a color filter substrate 200 in the LCD panel according to the present invention is described below with reference to FIG. 2.

First, a light shielding film for a black matrix is applied on a second light transmissive insulation substrate 200 and then patterned to form a black matrix 211 arranged in the shape of a lattice. Subsequently, an organic film for color filters is applied on the entire structure including the black matrix 211, and then, patterned to form R, G and B color filters 221 which partially overlap with the black matrix 211. Then, an overcoat film 231 is formed on the entire structure including the color filters 221, and a transparent organic film is applied thereon and then patterned to form column spacers 241 for maintaining a cell gap. Thereafter, a light transmissive conductive film is formed on the entire structure including the column spacers 241 to form a common electrode 251. At this time, ITO (Indium Tin Oxide) or IZO (Indium Zinc Oxide) may be used to form the light transmissive conductive film.

Although the column spacers 241 are formed on the overcoat film 231 in the color filter substrate 200 of this embodiment, the present invention is not limited thereto. That is, the column spacers 241 may be formed on any one of the black matrix 211, the color filter 221, the overcoat film 231 and the common electrode 251.

The TFT and color filter substrates 100 and 200 manufactured as described above are bonded by assembling the two substrates 100 and 200 such that the pixel electrode 191 and the common electrode 251 face each other. Thereafter, a predetermined sealing film may be applied along an edge of one of both the substrates to bond them. Next an LCD panel is manufactured by injecting liquid crystals between the two substrates 100 and 200 bonded together and sealing the two substrates 100 and 200 to form the liquid crystal layer 300.

In the LCD panel manufactured as described above, when an electric signal required to form an image is applied to the pixel electrode 191 through the TFT T formed in the display region A1 of the TFT substrate 100 and a common voltage is applied to the common electrode 251 of the color filter substrate 200, an electric field is formed between the pixel and common electrodes 191 and 251. Thus, the alignment of molecules of the liquid crystal layer 300 is changed through such an electric field, and light transmittance is changed in accordance with the changed alignment of the molecules, so that a desired image can be displayed.

In the aforementioned first and second embodiments, an LCD having an LCD panel provided therein has been illustrated as an example of displays. However, if a TFT and a photo diode are required to be formed and/or built in the interior of displays, the present invention may be applied to other displays, e.g., organic electro luminescence display (OELD) and the like.

As described above, according to the present invention, n-type and p-type TFTs and a photo diode can be together formed without an additional process when forming the TFTs using a polycrystalline silicon thin film, and various peripheral circuits can be configured using such elements. Accordingly, it is possible to reduce the manufacturing cost of a display and advantageously manufacture a display to be thin as compared with a prior art in which a variety of elements are separately manufactured and mounted on a TFT substrate.

Although the present invention has been described in connection with the accompanying drawings and the preferred embodiments, the present invention is not limited thereto but defined by the appended claims. Accordingly, it will be understood by those skilled in the art that various modifications and changes can be made thereto without departing from the spirit and scope of the invention defined by the appended claims.

What is claimed is:

1. A method of manufacturing a display, comprising:
providing a substrate having display and peripheral regions defined therein;
forming a plurality of TFTs in the shape of a lattice in the display region;
forming p-type and n-type TFTs in the peripheral region; and
forming at least one photo diode in the display or peripheral region, wherein the photo diode is simultaneously formed together with the p-type and n-type TFTs, and wherein the forming at least one photo diode further comprises:
forming an active layer for the p-type TFT, an active layer for the n-type TFT and an active layer for the photo diode on the substrate, wherein the active layer for the photo diode has a central region interposed between two opposing side regions;
using a first conductive film pattern formed on the substrate as an ion implantation mask, simultaneously implanting p-type ions into one of the side regions and into the active layer for the p-type TFT;
forming a barrier layer pattern on the first conductive film pattern;
etching the first conductive film pattern using the barrier layer pattern as an etching mask, so as to form a second conductive film pattern;
using the barrier layer pattern as an ion implantation mask, simultaneously implanting n-type ions into the other one of the side regions and into the active layer for the n-type TFT; and
etching the second conductive film pattern using the barrier layer pattern as an etching mask, so as to form a third conductive film pattern and gate electrodes of the plurality of TFTs in the display region and the n-type TFT in the peripheral region.

2. The method as claimed in claim 1, wherein at least one of the active layers for the p-type TFT, the n-type TFT and the photo diode is formed of a low temperature polycrystalline silicon thin film.

3. The method as claimed in claim 1, wherein the photo diode is formed in a horizontal structure.

4. A method of manufacturing a display, comprising:
forming an active layer for a p-type TFT, an active layer for an n-type TFT and an active layer for a photo diode on a surface of a substrate;
forming first and second p-type regions in the active layer for the p-type TFT with a central region thereof interposed between the first and second p-type regions;
forming a third p-type region in one side region of the active layer for the photo diode with a central region thereof interposed between the one side region and the other side region;
forming first and second n-type regions in the active layer for the n-type TFT with a central region thereof interposed between the first and second n-type regions; and
forming a third n-type region at the other side region of the active layer for the photo diode with the central region thereof interposed between the one side region and the other side region,
wherein the forming first and second p-type regions further comprises:
forming a first conductive film pattern on the substrate; and
implanting p-type ions into the corresponding active layers using the first conductive film pattern as an ion implantation mask to form the p-type regions at the corresponding regions of the active layers, and
wherein the forming first and second n-type regions further comprises:
forming a barrier layer pattern on the first conductive film pattern;
etching the first conductive film pattern using the barrier layer pattern as an etching mask to form a second conductive film pattern;
implanting n-type ions into the corresponding active layers using the barrier layer pattern as an ion implantation mask to form the n-type regions at the corresponding regions of the active layers; and
etching the second conductive film pattern using the barrier layer pattern as an etching mask to form a third conductive film pattern and gate electrode of the n-type TFT.

5. The method as claimed in claim 4, further comprising forming lightly doped drains at both sides of the central region of at least one of the active layers for the p-type TFT, the n-type TFT and the photo diode.

6. The method as claimed in claim 4, wherein at least one of the active layers for the p-type TFT, the n-type TFT and the photo diode is formed of a low temperature polycrystalline silicon thin film through:
forming a low temperature amorphous silicon thin film on top of the substrate; and crystallizing the silicon thin film through any one method of SPC (Solid Phase Crystallization), ELC (Excimer Laser Crystallization), and MIC (Metal Induced Crystallization).

* * * * *